US010811444B2

(12) United States Patent
    Jiang

(10) Patent No.: US 10,811,444 B2
(45) Date of Patent: Oct. 20, 2020

(54) METHOD FOR MANUFACTURING BACK CHANNEL ETCHING TYPE OXIDE SEMICONDUCTOR TFT SUBSTRATE

(71) Applicant: Shenzhen China Star Optoelectronics Semiconductor Display Technology Co., Ltd., Shenzhen, Guangdong (CN)

(72) Inventor: Chunsheng Jiang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 345 days.

(21) Appl. No.: 15/743,982

(22) PCT Filed: Dec. 14, 2017

(86) PCT No.: PCT/CN2017/116281
     § 371 (c)(1),
     (2) Date: Jan. 11, 2018

(87) PCT Pub. No.: WO2019/100464
     PCT Pub. Date: May 31, 2019

(65) Prior Publication Data
     US 2020/0152672 A1    May 14, 2020

(30) Foreign Application Priority Data
     Nov. 21, 2017 (CN) .......................... 2017 1 1168933

(51) Int. Cl.
     *H01L 27/12*     (2006.01)
     *H01L 27/32*     (2006.01)
     *H01L 51/52*     (2006.01)
(52) U.S. Cl.
     CPC ...... *H01L 27/1259* (2013.01); *H01L 27/1248* (2013.01); *H01L 27/1262* (2013.01); *H01L 27/3248* (2013.01); *H01L 51/5237* (2013.01)

(58) Field of Classification Search
     CPC ............ H01L 27/1248; H01L 51/5237; H01L 27/1259; H01L 27/1262
     See application file for complete search history.

(56) References Cited

U.S. PATENT DOCUMENTS

| 7,799,622 | B2 * | 9/2010 | Jung ................. H01L 29/66969 |
| | | | 257/E21.413 |
| 2009/0142887 | A1 | 6/2009 | Son et al. |
| 2016/0260836 | A1 * | 9/2016 | Okazaki ............. H01L 27/1225 |

FOREIGN PATENT DOCUMENTS

| CN | 103620788 A | 3/2014 |
| CN | 103887344 A | 6/2014 |

(Continued)

*Primary Examiner* — Amar Movva
(74) *Attorney, Agent, or Firm* — Hemisphere Law, PLLC; Zhigang Ma

(57) ABSTRACT

The present application provides a method for fabricating a back channel etching oxide semiconductor TFT substrate, by depositing the first passivation layer on the source, the drain and the active layer, and treating the oxygen element containing plasma to a surface of the first passivation layer, infiltrating traces of oxygen element into the superficial layer of the channel region of the active layer through the first passivation layer, then using an oxygen element containing plasma to treat the surface of the first passivation layer, so that the traces of oxygen element infiltrates into the superficial layer of the channel region of the active layer via the first passivation layer, to supply the oxygen element to the superficial layer of the channel region, and ensure the oxygen element balance in the superficial layer, the first passivation layer acts as a barrier layer to ensure the stability of the TFT.

15 Claims, 4 Drawing Sheets

(56) References Cited

FOREIGN PATENT DOCUMENTS

CN         104637952 A     5/2015
JP          2016108659 A  *  6/2016  .......... H01L 21/308

\* cited by examiner

METHOD FOR MANUFACTURING BACK CHANNEL ETCHING TYPE OXIDE SEMICONDUCTOR TFT SUBSTRATE

RELATED APPLICATIONS

The present application is a National Phase of International Application Number PCT/CN2017/116281, filed on Dec. 14, 2017, and claims the priority of China Application 201711168933.1, filed on Nov. 21, 2017.

FIELD OF THE DISCLOSURE

The disclosure relates to a display technical field, and more particularly to a method for manufacturing back channel etching type oxide semiconductor TFT substrate.

BACKGROUND

Liquid crystal displays, LCDs have many advantages such as thin body, low power consumption and no radiation, and are widely used in mobile phones, personal digital assistants, PDAs, digital cameras, computer screens or notebook computer panels and so on.

Organic light-emitting diode, OLED display, also called organic electroluminescent display, is a new type of flat panel display device. Due to its advantages of simple fabrication process, low cost, low power consumption, high light-emitting luminance, wide operating adaptation temperature, small size, fast response, and easy to achieve color display and large-screen display, easy to implement and matching with integrated circuit driver, easy to achieve of flexible display, which has broad application prospects.

OLEDs can be classified into passive matrix OLEDs, PMOLEDs and active matrix OLEDs, AMOLEDs according to driving modes, namely, direct addressing and thin film transistor matrix addressing two categories. Wherein, AMOLED has a matrix arrangement of pixels, belonging to the active display type, high luminous efficiency, usually used for high resolution large-size display device.

Thin Film Transistors, TFTs are the main driving elements in liquid crystal display devices and active matrix OLED display devices, and are directly related to the development direction of high-performance flat panel display devices. The thin film transistor has a variety of structures. There are many kinds of materials for fabricating the thin film transistor of the corresponding structure, and the amorphous silicon, a-Si material is the most common material. However, with the development of liquid crystal display devices and OLED display devices in the direction of large size and high resolution, the mobility of the conventional a-Si with only about 1 $cm^2/(Vs)$ has been unable to meet the requirements. The metal oxide material represented by Indium Gallium Zinc Oxide, IGZO has a mobility of more than 10 $cm^2/(Vs)$. Moreover, the fabrication of the corresponding thin film transistor is compatible with the existing a-Si semiconductor-driven thin film transistor line and has rapidly become the focus of research and development in the field of display in recent years.

Compared with the conventional a-Si TFT, IGZO TFT has the following advantages:

1, improving the resolution of the display backplane, under the premise of ensuring the same transmittance, the resolution of the IGZO TFT display backplane can be fabricated more than 2 times of the a-Si TFT, the carrier concentration of the IGZO material is high, mobility is high to reduce the size of the TFT, and to ensure the upgrade of the resolution;

2, reduce the energy consumption of the display device, comparing to IGZO TFT, a-Si TFT and LTPS TFT, the leakage current is less than 1 pA; the driving frequency is from the original 30-50 Hz reduced to 2-5 Hz, by special processes, it can even down to 1 Hz, although the number of driving TFTs is reduced, the alignment of the liquid crystal molecules can be maintained, without affecting the quality of the image, thereby reducing the power consumption of the display backplane; in addition, the high mobility of the IGZO semiconductor material enables smaller TFTs to provide sufficient charge capacity and higher capacitance, but also increase the aperture of the liquid crystal panel, the effective area of light transmitting becomes larger, the same luminance can be achieved with fewer backplane components or low power consumption, and the energy consumption can be reduced.

3, by using intermittent driving and other methods, the impact on the touch screen detection circuit caused by the noise of the liquid crystal display driving circuit can be reduced, to achieve higher sensitivity, and even the tip of the ballpoint pen can respond, and since the power can be cut off during the image is no update, the performance in energy saving is even better.

At present, the IGZO TFT used as a semiconductor active layer generally adopts an etch stop layer, ESL structure. Due to the presence of an etch stop layer, during etching process of a source/drain, the etch stop layer can effectively protect the IGZO from affected, to ensure the excellent semiconductor properties of the TFT. However, the fabrication process of IGZO TFT with ESL structure is complicated and requires six lithography processes, and is not conducive to cost reduction. Therefore, the development of IGZO TFT with a back-channel etching, BCE structure with less lithography processes is generally pursued.

The BCE structure of the IGZO TFT is realized by removing the etch stop layer while using metal copper to fabricate the source and drain, to reduce one of the lithography processes. However, the existing copper etching solution is inevitable to have a certain degree of damage to the active layer of the IGZO, and to cause the surface characteristics of the active layer of the IGZO changed, so that the stability of the TFT substrate is deteriorated. The commonly used copper etching solution is hydrogen peroxide ($H_2O_2$) based, to have less damage to the IGZO active layer, especially the fluorine (F) free copper etching solution. However, experimental verification shows that fluorine free copper etching solution still damages the IGZO active layer, in particular, the damages of the oxygen element (O) balance in the superficial layer of the back channel easily affects the leakage current ($I_{off}$) and the working stability of the TFT device.

SUMMARY

An object of the present application is to provide a method for fabricating a back channel etching type oxide semiconductor TFT substrate, to ensure the oxygen element balance of the superficial layer in the channel region, and ensure the working stability of the TFT.

To achieve the above object, the present application provides a method for fabricating a back channel etching type oxide semiconductor TFT substrate, including:

Providing a base substrate, forming a gate on the base substrate, forming a gate insulating layer covering the gate on the base substrate, forming an active layer on the gate insulating layer corresponding to and above the gate, wherein the active layer is a metal oxide semiconductor material;

Forming a source and a drain on the active layer and the gate insulating layer, defining a channel region located between the source and the drain, a source contact region located on a side of the channel region and in contact with the source, and a drain contact region located in the other side of the channel region and in contact with the drain on the active layer by the source and the drain;

Depositing a first passivation layer on the source, the drain and the active layer;

Treating a surface of the first passivation layer by an oxygen element containing plasma, infiltrating traces of oxygen element into a superficial layer of the channel region of the active layer via the first passivation layer, supplying an oxygen element to the superficial layer of the channel region, and ensuring an oxygen element balance of the superficial layer;

Depositing a second passivation layer on the first passivation layer; and

Forming a through hole on the first passivation layer and the second passivation layer corresponding to the source, forming a pixel electrode on the second passivation layer, and the pixel electrode contacting with the source through the through hole.

A material of the active layer includes indium gallium zinc oxide.

Materials of the source and the drain include metallic copper.

An etching solution used in a lithography process of the source and the drain is a fluorine free hydrogen peroxide based copper etching solution.

An oxygen element balance of the superficial layer refers to reaching a content of the oxygen element in the superficial layer before the etching of the source and the drain.

A material of the first passivation layer is silicon oxide, the thickness of the first passivation layer is 500 Å-1000 Å.

The oxygen element containing plasma is a nitrous oxide plasma.

A process of treating the surface of the first passivation layer with oxygen element containing plasma is performed in a manner of plasma enhanced chemical vapor deposition, and the power and pressure of the chemical vapor deposition are enhanced by controlling the plasma to ensure only traces of oxygen element infiltrating into the superficial layer of the channel region of the active layer via the first passivation layer and achieving an oxygen element balance of the superficial layer.

A material of the second passivation layer is silicon oxide, and the thickness of the second passivation layer is 1500 Å-2000 Å.

A material of the pixel electrode includes indium tin oxide.

The present application further provides a method for fabricating a back channel etching oxide semiconductor TFT substrate, including the steps of:

Providing a base substrate, forming a gate on the base substrate, forming a gate insulating layer covering the gate on the base substrate, forming an active layer on the gate insulating layer corresponding to and above the gate, wherein the active layer is a metal oxide semiconductor material;

Forming a source and a drain on the active layer and the gate insulating layer, defining a channel region located between the source and the drain, a source contact region located on a side of the channel region and in contact with the source, and a drain contact region located in the other side of the channel region and in contact with the drain on the active layer by the source and the drain;

Depositing a first passivation layer on the source, the drain and the active layer;

Treating a surface of the first passivation layer by an oxygen element containing plasma, infiltrating traces of oxygen element into a superficial layer of the channel region of the active layer via the first passivation layer, supplying an oxygen element to the superficial layer of the channel region, and ensuring an oxygen element balance of the superficial layer;

Depositing a second passivation layer on the first passivation layer;

Forming a through hole on the first passivation layer and the second passivation layer corresponding to the source, forming a pixel electrode on the second passivation layer, and the pixel electrode contacting with the source through the through hole;

Wherein a material of the active layer includes indium gallium zinc oxide;

Wherein materials of the source and the drain includes metallic copper;

Wherein an etching solution used in a lithography process of the source and the drain is a fluorine free hydrogen peroxide based copper etching solution;

Wherein a material of the first passivation layer is silicon oxide, the thickness of the first passivation layer is 500 Å-1000 Å; and Wherein an oxygen element balance of the superficial layer refers to reaching a content of the oxygen element in the superficial layer before the etching of the source and the drain.

Beneficial effects of the present application: the present application provides a method for fabricating a back channel etching oxide semiconductor TFT substrate, by depositing the first passivation layer on the source, the drain and the active layer, and treating the oxygen element containing plasma to a surface of the first passivation layer, infiltrating traces of oxygen element into the superficial layer of the channel region of the active layer through the first passivation layer, then using an oxygen element containing plasma to treat the surface of the first passivation layer, so that the traces of oxygen element infiltrates into the superficial layer of the channel region of the active layer via the first passivation layer, to supply the oxygen element to the superficial layer of the channel region, and ensure the oxygen element balance in the superficial layer, and during the plasma treatment process, the first passivation layer acts as a barrier layer to the source and drain, so that only traces of oxygen element can reach the source and drain, not enough to cause oxidation of the source and drain, to ensure the stability of the TFT.

For further understanding of the features and technical contents of the present application, reference should be made to the following detailed description and accompanying drawings of the present application. However, the drawings are for reference only and are not intended to limit the present application.

BRIEF DESCRIPTION OF THE DRAWINGS

The technical solutions of the present application and other beneficial effects will be apparent from the following detailed description of specific embodiments of the present application with reference to the accompanying drawings.

In the drawings.

DETAILED DESCRIPTION OF PREFERRED EMBODIMENTS

To further illustrate the technical means adopted by the present invention and the effects thereof, the following describes the preferred embodiments of the present invention and the accompanying drawings in detail.

Figure 1:
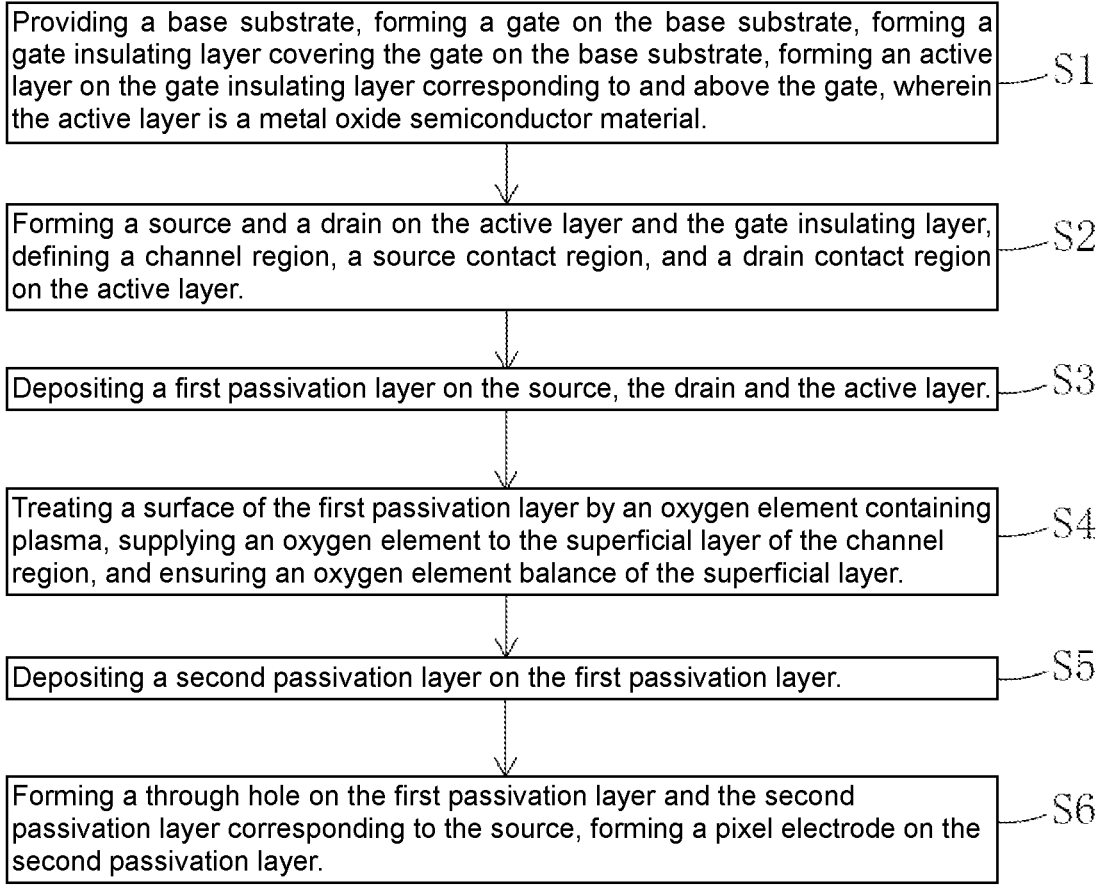
FIG. 1 is a flow chart of a method for fabricating a back channel etching oxide semiconductor TFT substrate according to the present application.
Figure 2:
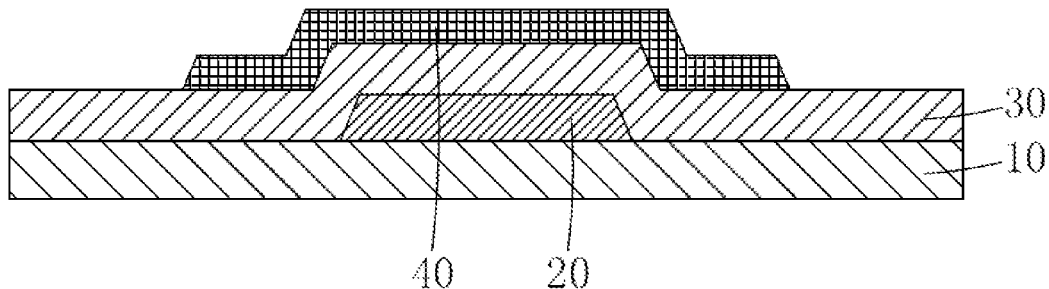
FIG. 2 is a schematic diagram of the method for fabricating the back channel etching type oxide semiconductor TFT substrate in step S1 according to the present application.

Referring to FIG. 1, the present application provides a method for fabricating a back channel etching oxide semiconductor TFT substrate, including the steps of:

Step S1, as shown in FIG. 2, providing a base substrate 10, forming a gate 20 on the base substrate 10, forming a gate insulating layer 30 covering the gate 20 on the base substrate 10, forming an active layer 40 on the gate insulating layer 30 corresponding to and above the gate 20, the active layer 40 is a metal oxide semiconductor material.

Specifically, the material of the active layer 40 includes indium gallium zinc oxide (IGZO).

Figure 3:
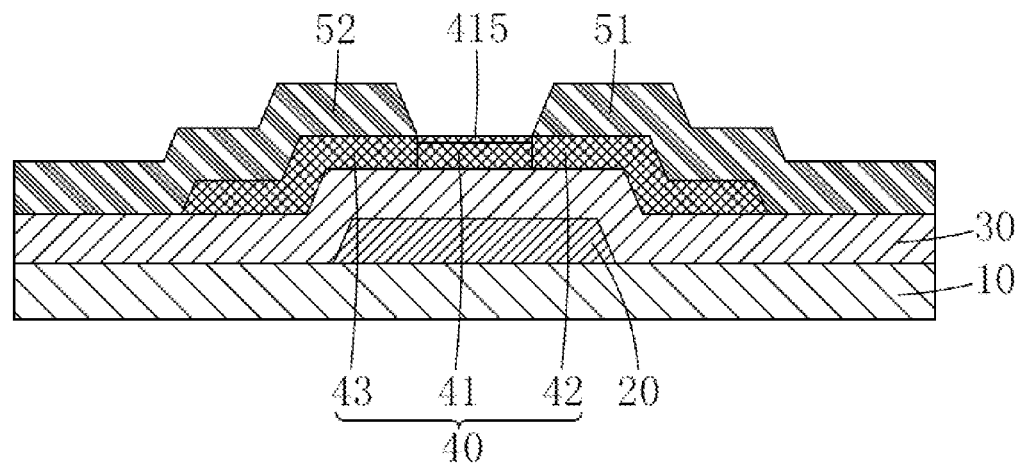
FIG. 3 is a schematic diagram of the method for fabricating the back channel etching type oxide semiconductor TFT substrate in step S2 according to the present application.

Step S2, as shown in FIG. 3, forming a source 51 and a drain 52 on the active layer 40 and the gate insulating layer 30, defining a channel region 41 located between the source 51 and the drain 52, a source contact region 42 located on a side of the channel region 41 and in contact with the source 51, and a drain contact region 43 located in the other side of the channel region 41 and in contact with the drain 52 on the active layer 40 by the source 51 and the drain 52.

Specifically, the material of the source 51 and the drain 52 includes metal copper, and an etching solution used in the lithography process of the source 51 and the drain 52 is a fluorine free hydrogen peroxide based copper etching solution. Although the fluorine free hydrogen peroxide based copper etching liquid has less damage to the channel region 41, but it still causing damage to the balance of oxygen element in the superficial layer 415 of the channel region 41, reduce the oxygen element content in the superficial layer 415 of the channel region 41, and generate more oxygen element vacancy on a surface of the IGZO.

Figure 4:
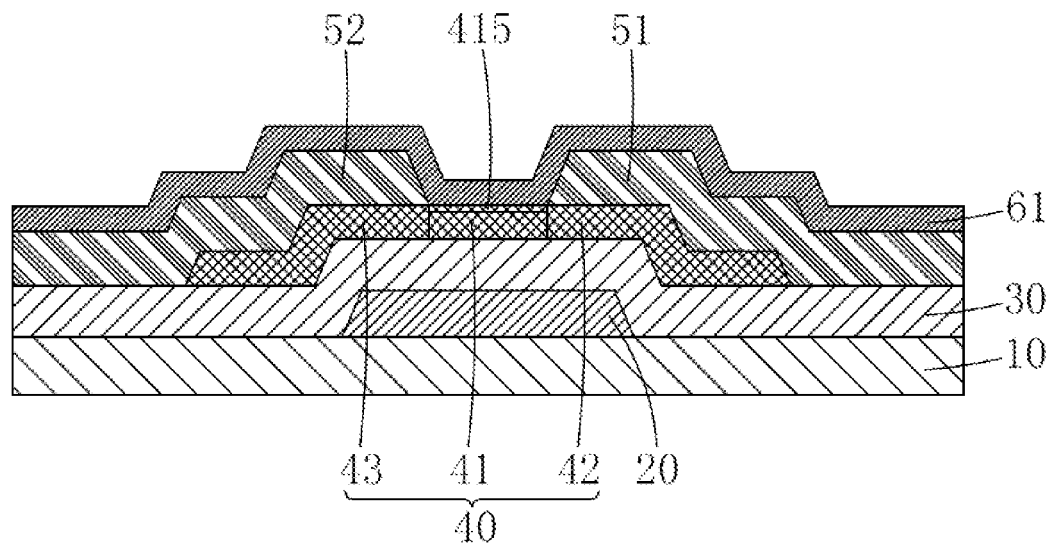
FIG. 4 is a schematic diagram of the method for fabricating the back channel etching type oxide semiconductor TFT substrate in step S3 according to the present application.

Step S3, as shown in FIG. 4, depositing a first passivation layer 61 on the source 51, the drain 52 and the active layer 40.

Specifically, the material of the first passivation layer 61 is silicon oxide ($SiO_x$), and the thickness of the first passivation layer 61 is 500 Å-1000 Å.

Figure 5:
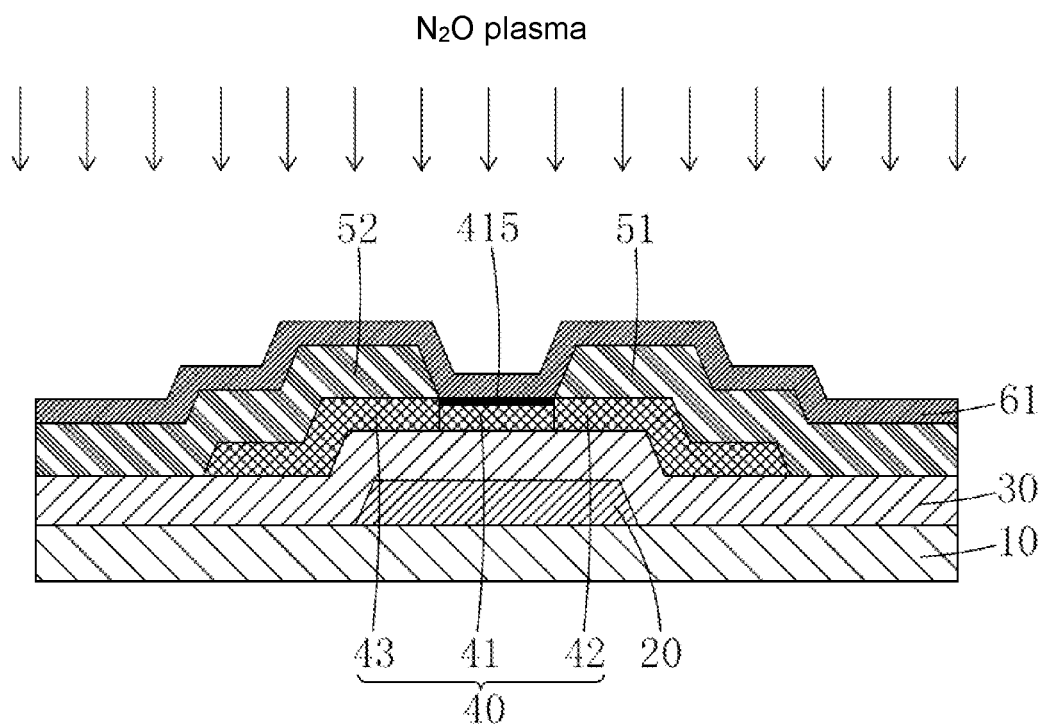
FIG. 5 is a schematic diagram of the method for fabricating the back channel etching type oxide semiconductor TFT substrate in step S4 according to the present application.

Step S4, as shown in FIG. 5, treating a surface of the first passivation layer 61 by an oxygen element containing plasma, infiltrating traces of oxygen element into the superficial layer 415 of the channel region 41 of the active layer 40 via the first passivation layer 61, supplying the oxygen element to the superficial layer 415 of the channel region 41, and ensuring the oxygen element balance of the superficial layer 415.

Performing the oxygen element supplement to the superficial layer 415 of the channel region 41 can improve the oxygen element content of the IGZO, and reduce the oxygen element vacancies on the surface of the IGZO, so as to compensate the influences on the IGZO of the channel region 41 when the source 51 and the drain 52 are etched.

Specifically, the oxygen element balance of the superficial layer 415 refers to reaching the content of the oxygen element in the superficial layer 415 before the source and the drain are etched.

Specifically, the oxygen element containing plasma is a nitrous oxide ($N_2O$) plasma.

Specifically, a process of treating the surface of the first passivation layer 61 with oxygen element containing plasma is performed in a manner of plasma enhanced chemical vapor deposition, PECVD, and the power and pressure of the chemical vapor deposition are enhanced by controlling the plasma, so as to ensure that only traces of oxygen element infiltrates into the superficial layer 415 of the channel region 41 of the active layer 40 via the first passivation layer 61, to achieve the oxygen element balance of the superficial layer 415.

During the plasma treatment process, the first passivation layer 61 functions as a barrier layer for the source 51 and the drain 52, so that only traces of oxygen element can reach the source 51 and the drain 52, not enough for causing oxidation to the source 51 and drains 52.

In the case of no barrier layer provided above the source 51 and the drain 52, the oxygen element containing plasma oxidizes the metallic copper of the source 51 and the drain 52, to lower the adhesion between the source 51, the drain 52 and the passivation layer thereover, to cause the lift-up and bubbling of the passivation layer thereover, and influences the electrical contact between a pixel electrode 70 formed thereafter to the source 51 and the drain 52.

Figure 6:
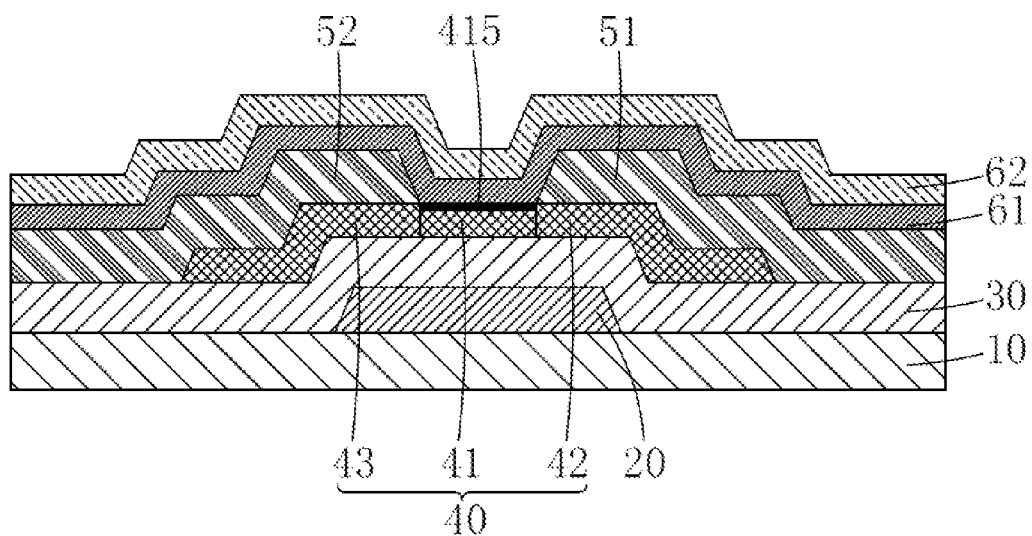
FIG. 6 is a schematic diagram of the method for fabricating the back channel etching type oxide semiconductor TFT substrate in step S5 according to the present application.

Step S5, as shown in FIG. 6, depositing a second passivation layer 62 on the first passivation layer 61.

Specifically, the material of the second passivation layer 62 is silicon oxide ($SiO_x$), and the thickness of the second passivation layer 62 is 1500 Å-2000 Å.

Figure 7:
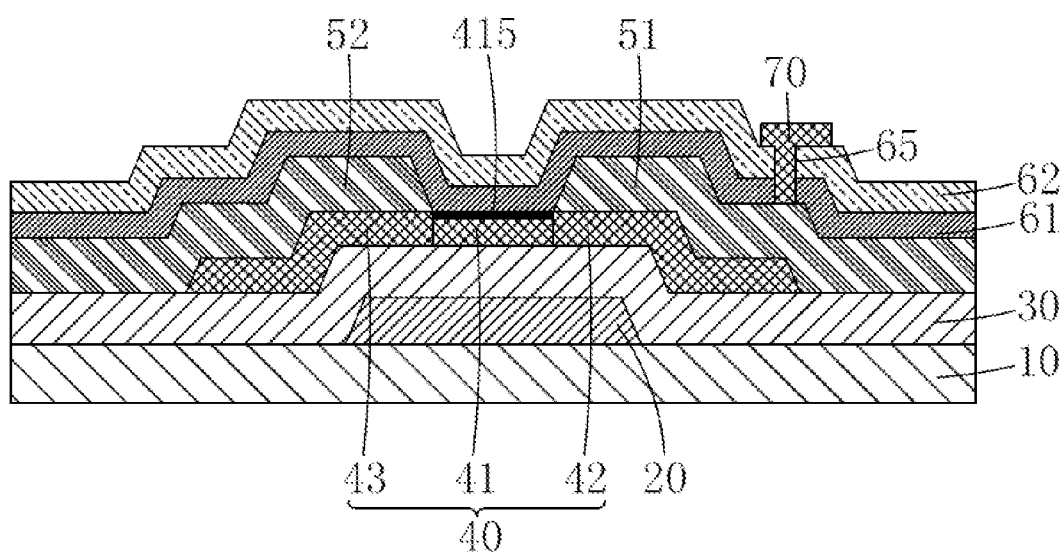
FIG. 7 is a schematic diagram of the method for fabricating the back channel etching type oxide semiconductor TFT substrate in step S6 according to the present application.

Step S6, as shown in FIG. 7, forming a through hole 65 corresponding to the source 51 on the first passivation layer 61 and the second passivation layer 62. Forming the pixel electrode 70 on the second passivation layer 62, and the pixel electrode 70 contacts with the source 51 through the through hole 65.

Specifically, the material of the pixel electrode 70 includes indium tin oxide (ITO).

In conclusion, the present application provides a method for fabricating a back channel etching oxide semiconductor TFT substrate, by depositing the first passivation layer on the source, the drain and the active layer, and treating the oxygen element containing plasma to a surface of the first passivation layer, infiltrating traces of oxygen element into the superficial layer of the channel region of the active layer through the first passivation layer, then using an oxygen element containing plasma to treat the surface of the first passivation layer, so that the traces of oxygen element infiltrates into the superficial layer of the channel region of the active layer via the first passivation layer, to supply the oxygen element to the superficial layer of the channel region, and ensure the oxygen element balance in the superficial layer, and during the plasma treatment process, the first passivation layer acts as a barrier layer to the source and drain, so that only traces of oxygen element can reach the source and drain, not enough to cause oxidation of the source and drain, to ensure the stability of the TFT.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method for fabricating a back channel etching oxide semiconductor TFT substrate, comprising the steps of:
   providing a base substrate, forming a gate on the base substrate, forming a gate insulating layer covering the gate on the base substrate, forming an active layer on the gate insulating layer corresponding to and above the gate, wherein the active layer is a metal oxide semiconductor material;
   forming a source and a drain on the active layer and the gate insulating layer based on a lithography process, and thereby defining a channel region located between the source and the drain, a source contact region located on a side of the channel region and in contact with the source, and a drain contact region located in the other side of the channel region and in contact with the drain on the active layer by the source and the drain, wherein oxygen element vacancies are generated resulting from a damage of an etching solution used in the lithography process to a balance of oxygen element in a superficial layer of the channel region;
   depositing a first passivation layer in contact with the source, the drain and the active layer;
   treating a surface of the first passivation layer by an oxygen element containing plasma directly applied onto the surface to infiltrate traces of oxygen element into the superficial layer of the channel region of the active layer via the first passivation layer and thereby supply an oxygen element to the superficial layer of the channel region to reduce the oxygen element vacancies, wherein during treating the surface of the first passivation layer by the oxygen element containing plasma, the first passivation layer is used as a barrier layer for the source and the drain so that only traces of oxygen element reach the source and the drain and are not enough for causing oxidation to the source and drains;
   depositing a second passivation layer in contact with the surface of the first passivation layer after the treating; and
   forming a through hole on the first passivation layer and the second passivation layer corresponding to the source, forming a pixel electrode on the second passivation layer, and the pixel electrode contacting with the source through the through hole.

2. The method for fabricating the back channel etching oxide semiconductor TFT substrate according to claim 1, wherein a material of the active layer comprises indium gallium zinc oxide.

3. The method for fabricating the back channel etching oxide semiconductor TFT substrate according to claim 1, wherein materials of the source and the drain comprise metallic copper.

4. The method for fabricating the back channel etching oxide semiconductor TFT substrate according to claim 3, wherein the etching solution used in the lithography process of the source and the drain is a fluorine free hydrogen peroxide based copper etching solution.

5. The method for fabricating the back channel etching oxide semiconductor TFT substrate according to claim 1, wherein a material of the first passivation layer is silicon oxide, the thickness of the first passivation layer is 500Å-1000Å.

6. The method for fabricating the back channel etching oxide semiconductor TFT substrate according to claim 1, wherein the oxygen element containing plasma is a nitrous oxide plasma.

7. The method for fabricating the back channel etching oxide semiconductor TFT substrate according to claim 1, wherein a process of treating the surface of the first passivation layer with oxygen element containing plasma is performed in a manner of plasma enhanced chemical vapor deposition, and the power and pressure of the chemical vapor deposition are enhanced by controlling the plasma to ensure only traces of oxygen element infiltrating into the superficial layer of the channel region of the active layer via the first passivation layer and achieving an oxygen element balance of the superficial layer.

8. The method for fabricating the back channel etching oxide semiconductor TFT substrate according to claim 1, wherein an oxygen element balance of the superficial layer refers to reaching a content of the oxygen element in the superficial layer before the etching of the source and the drain.

9. The method for fabricating the back channel etching oxide semiconductor TFT substrate according to claim 1, wherein a material of the second passivation layer is silicon oxide, and the thickness of the second passivation layer is 1500Å-2000Å.

10. The method for fabricating the back channel etching oxide semiconductor TFT substrate according to claim 1, wherein a material of the pixel electrode comprises indium tin oxide.

11. A method for fabricating a back channel etching oxide semiconductor TFT substrate, comprising the steps of:
   providing a base substrate, forming a gate on the base substrate, forming a gate insulating layer covering the gate on the base substrate, forming an active layer on the gate insulating layer corresponding to and above the gate, wherein the active layer is a metal oxide semiconductor material;
   forming a source and a drain on the active layer and the gate insulating layer based on a lithography process, and thereby defining a channel region located between the source and the drain, a source contact region located on a side of the channel region and in contact with the source, and a drain contact region located in the other side of the channel region and in contact with the drain on the active layer by the source and the drain, wherein oxygen element vacancies are generated resulting from a damage of an etching solution used in the lithography process to a balance of oxygen element in a superficial layer of the channel region;

depositing a first passivation layer in contact with the source, the drain and the active layer;

treating a surface of the first passivation layer by an oxygen element containing plasma directly applied onto the surface to infiltrate traces of oxygen element into the superficial layer of the channel region of the active layer via the first passivation layer and thereby supply an oxygen element to the superficial layer of the channel region to reduce the oxygen element vacancies, wherein during treating the surface of the first passivation layer by the oxygen element containing plasma, the first passivation layer is used as a barrier layer for the source and the drain;

depositing a second passivation layer in contact with the surface of the first passivation layer after the treating;

forming a through hole on the first passivation layer and the second passivation layer corresponding to the source, forming a pixel electrode on the second passivation layer, and the pixel electrode contacting with the source through the through hole;

wherein a material of the active layer comprises indium gallium zinc oxide;

wherein materials of the source and the drain comprise metallic copper;

wherein an etching solution used in a lithography process of the source and the drain is a fluorine free hydrogen peroxide based copper etching solution;

wherein a material of the first passivation layer is silicon oxide, the thickness of the first passivation layer is 500Å-1000Å; and wherein an oxygen element balance of the superficial layer refers to reaching a content of the oxygen element in the superficial layer before the etching of the source and the drain.

12. The method for fabricating the back channel etching oxide semiconductor TFT substrate according to claim 11, wherein the oxygen element containing plasma is a nitrous oxide plasma.

13. The method for fabricating the back channel etching oxide semiconductor TFT substrate according to claim 11, wherein a process of treating the surface of the first passivation layer with oxygen element containing plasma is performed in a manner of plasma enhanced chemical vapor deposition, and the power and pressure of the chemical vapor deposition are enhanced by controlling the plasma to ensure only traces of oxygen element infiltrating into the superficial layer of the channel region of the active layer via the first passivation layer and achieving an oxygen element balance of the superficial layer.

14. The method for fabricating the back channel etching oxide semiconductor TFT substrate according to claim 11, wherein a material of the second passivation layer is silicon oxide, and the thickness of the second passivation layer is 1500Å-2000Å.

15. The method for fabricating the back channel etching oxide semiconductor TFT substrate according to claim 11, wherein a material of the pixel electrode comprises indium tin oxide.

* * * * *